(12) United States Patent
Karlsberg

(10) Patent No.: US 7,069,194 B2
(45) Date of Patent: Jun. 27, 2006

(54) SYSTEM AND METHOD FOR GENERATING INTEGRATED DATA MODELS

(75) Inventor: Jerry J. Karlsberg, Mercer Island, WA (US)

(73) Assignee: The Boeing Company, Chicago, IL (US)

( * ) Notice: Subject to any disclaimer, the term of this patent is extended or adjusted under 35 U.S.C. 154(b) by 649 days.

(21) Appl. No.: 10/039,402

(22) Filed: Oct. 26, 2001

(65) Prior Publication Data

US 2003/0083767 A1 May 1, 2003

(51) Int. Cl.
*G06F 17/50* (2006.01)
(52) U.S. Cl. .......................................... 703/1; 700/97
(58) Field of Classification Search .................... 703/2, 703/13, 1; 700/97, 182; 716/2
See application file for complete search history.

(56) References Cited

U.S. PATENT DOCUMENTS

| | | | |
|---|---|---|---|
| 5,191,534 A | 3/1993 | Orr et al. | |
| 5,418,728 A | 5/1995 | Yada | |
| 5,883,818 A * | 3/1999 | Salimi et al. ................... | 716/2 |
| 36,602 A | 3/2000 | Sebastian et al. ...... | 364/468.03 |
| 6,195,594 B1 | 2/2001 | Shah et al. | |
| 6,230,066 B1 | 5/2001 | Sferro et al. ................. | 700/104 |
| 6,249,714 B1 * | 6/2001 | Hocaoglu et al. ............. | 700/97 |
| 6,535,795 B1 * | 3/2003 | Schroeder et al. .......... | 700/266 |
| 6,536,935 B1 * | 3/2003 | Parunak et al. ............... | 700/99 |
| 6,546,311 B1 * | 4/2003 | Brown ....................... | 700/200 |

* cited by examiner

*Primary Examiner*—Albert W. Paladini
(74) *Attorney, Agent, or Firm*—Lee & Hayes, PLLC

(57) ABSTRACT

A system and method for automatically and rapidly generating an integrated data model of a manufactured product are provided. An input file containing parameters for the manufactured product comprising, for example, dimensions of the finished product, dictates the dimensions of the resulting integrated data model. A rules database constrains modeling to integrate the engineered properties of the resulting model. The properties and materials are defined responsive to the parameters set forth in the input file, and selected according to a predetermined set of properties and materials rules for each component of each system comprised within the product. Successive iterations of the modeling process with informed changes to the input file or rules should yield better approximations of the finished product, thereby allowing immediate and incremental improvements by all engineering disciplines.

111 Claims, 6 Drawing Sheets

SYSTEM AND METHOD FOR GENERATING INTEGRATED DATA MODELS

FIELD OF THE INVENTION

This invention relates generally to engineering design tools and, more specifically, to integrated data model generation tools.

BACKGROUND OF THE INVENTION

Designing and building complex systems, such as aircraft, space vehicles, marine vessels, marine platforms such as oil rigs, land vehicles such as automobiles and trucks, and the like, is a complex process that involves several disciplines. For example, typically several years of design, testing, analysis, and systems integration are performed before a complex system is put into operation. Furthermore, before the technician builds a component, subassembly, or assembly, an engineer analyzes a design for that component, subassembly, or assembly.

Engineers, typically, do not begin with a "clean sheet" nor is this approach useful. Most engineering is the result of extensive analysis of what has come before. Testing and analysis of materials inform the process of generating elements that are both structurally sound and adequate to the stresses imparted in use. Engineers learn by the repeated testing of materials, designs, structures, and configurations, even to the point of destruction. Indeed, most of the science of engineering in fields such as aviation stems from the wreckage of earlier designs.

The purpose of informed engineering is to change designs incrementally. It is inherent in the process of design that the design allows only a single variable within the design of a component, subassembly, or assembly under study to fluctuate, in order to track the effect of that variable. From these incremental changes in design and the changes in performance rendered by each, engineers abstract rules of design. Such rules might entail design constraints representing the minimum bending radius of structural aluminum or the safe load borne by a copper electrical conductor of a given diameter. Once abstracted, these rules dictate the farther variability in design of a component, subassembly, or assembly.

The domain of rules need not be restricted to matters relating only to safety or to performance. Indeed, there are rules that dictate the "look" of contemporary products. Any of the several offerings of the Volkswagen® line of the sixties and early seventies are immediately recognizable as Volkswagen®. Selectric® typewriters from the sixties to the late eighties also adhered to a particular profile that identified them as the products of IBM.

Rules exist stemming from every discipline are necessary to produce a product. Structural rules, design rules, functional dictates inform each step of the production of any modern product. There exists a need for these disciplines to reach a common starting point and from that point to quickly refine a design into a product.

The most complex of commercial products exist as the aggregation of mature technologies in a constellation of systems. Where manufacturers seek to introduce new technologies into the market place, they will mature the technology to the point that experience can assure the engineers of reliability. Thus the "rules set" for each discrete system is also matured.

An automobile, for instance, exists as the aggregation of fuel, power train, suspension, electrical, lighting, and hydraulic systems including brakes. Engineers know the specifications of a brake system necessary to safely stop a three-thousand-pound automobile. So too, they know the cooling capacity of the radiator necessary to cool a eight cylinder engine running under a particular load. Engineers know the rules of scale and application by the time a technology is mature enough for the marketplace.

Manufacturers have entire databases defining the individual components of the extant systems and the performance expected from each. Even at the sub-component level of process and material engineering, the manufacturers have studied extensively the materials they use, the machining, forging, or tooling that is possible or prudent with each of the materials, and the optimum application for each. Where the information relating to one application of a particular system is not complete, the resources certainly exist to complete it. These, too, are rules.

As discussed above, complete innovation is not desirable in commercial production. Once a manufacturer proposes a product to fill a niche in the manufacturer's product line, that niche defines the general dimensions and requirements of the product. Harkening again to the example of the automobile, a mid-size automobile might have a given weight and application. That weight and application will dictate a certain size of engine and attendant power train components, that size dictates the fuel delivery system necessary. Similarly, the mass of the proposed aggregate car will define the size of the braking system and suspension. Price points will dictate interior and trim packages. From such rules, there emerges a "blank" for the designers to manipulate into the new automotive product.

It should be possible to use computers to generate this "blank." Even second and third generation "blanks" should be possible as Engineers learn, select and weigh more and more of the distinct parameters of the product through the study of the prior generation model. Each generation of blank should yield more definition and, given the interlocking nature of the rules, if a solution is possible, such increasingly refined "blanks" should continue to result. The models quickly cease to be blanks as they are refined. Thus, in the example, the parameter mid-sized sedan automobile with anti-lock brakes might define a nearly formed, absent cosmetic details, automobile.

Currently, to prototype a new product, is an extremely time-consuming process requiring much iteration. Engineers from each discipline will develop, from a set of requirements, a preliminary design document. This preliminary design document is, itself, the product of application of a series of known rules. From the preliminary design document, a designer configures a two-dimensional centerline preliminary design drawing. The preliminary design drawing represents definition of lines of a component, but the preliminary design drawing does not represent structure of the component. A designer takes the line definition from the preliminary design drawing and develops structural definition for the component. Structural definition comprises assigning properties and materials, and gages. Next, a designer generates surfaces for the component based on the structural definition. Surface generation is a very detailed, time-consuming process.

In surface generation, engineers impart the geometry and design information by using a computer assisted drafting ("CAD") platform such as CATIA® or Unigraphics®. This process, too, is very time consuming. There are some economies available, especially as to where the configuration of particular elements are well-settled such as the general configuration of the empennage of an aircraft or the suspension of automobile. The production of such details as handles and latches still require a great number of placements. This situation exists in spite of the vast wealth of information that most manufacturers have as to a preferred or extant system for each operation or feature of the anticipated product. The CAD production of design drawings is laborious due to the hugely repetitious and principally rule-dictated decisions as to placement and deployment.

CAD drawings are not, themselves, complete representations of any but the most uniform surfaces. While the traditional views in three projections will well define a cube or a cylinder, the complex curvatures of most parts eludes definition by CAD. Many parts are designed with complex curves to maximize strength and to minimize weight and price of a component in a given application. These do not readily yield to definition in three projections. The best demonstration of this variability in surface description by two-dimensioned drawings in a traditional setting is the lofting of lines for the building of boat hulls. The stiffness of the battens used to connect well-defined lines while lofting a designer's plans might differentiate one boatyard's product from another. The resulting hulls might have very distinct performance characteristics when driven.

From the CAD-produced two-dimensional representations of the model, computers must then extract a surface geometry, exporting it to a modeling-computing environment such as UNIX. Because such generated surfaces typically include flaws or variability, the designers must clean up and make fair the surfaces. For example, the current state of the art uses meshing operations in commercially available modeling software. Soft software is notorious for introducing surface flaws. In most cases, where flaws in the surface generated cause the surface itself to be unworkable, designers must entirely recreate that surface. Again, much of the fairing of the surface relies upon a rule-dictated process. This laborious and time-consuming process precludes rapid design iteration.

Still further operation is necessary before the model is ripe for study. Once the process defines the surface, engineers must test the properties of the design. For this, the design is broken into finite elements. Each element consists of materials with properties that define the element's performance. The engineers evaluate the resulting whole for mass, balance, and structure. Each model can then be subject to static and dynamic testing, as desired or required. Evaluation often dictates changes necessary to meet design criteria. These changes trigger the reiteration of the process beginning at the generation of two-dimensional CAD drawings.

This design process is inherently iterative. Engineers of the several disciplines will continue to refine the first design by testing or by application of rules through many, many iterations until the product of the process meets all of the objectives of the design. Finally, the design process must integrate all the finite elements into a model of a subassembly or assembly. When the process integrates the component, subassembly and assembly models into a single model, the engineers document the model, and the model is released. The above process can take thousands of labor hours and hundreds of manufacturing days, and represents just one single iteration of the design process.

Slicing has proven far easier than lofting. Where a three-dimensional model exists, producing two-dimensional drawings representative of the model is a relatively simple and extremely accurate process. The desired process, then, would begin with the generation of a study model of the desired product in three-dimensions.

If general dimensions and assumptions about a desired product could, through application of rules and integration of known design parameters, result in a reliably lofted and documented model of the desired product, the huge expense of one or several iterations of the design process would be greatly diminished or avoided. Further, if that model where readily accessible by the various software that test and analyze each of the components, the documentation result in far faster iterations of the design.

Thus, there is an unmet need in the art for a rapid, automated system and method for generating integrated data models that reduces analysis cycle time, and responds immediately to changes.

SUMMARY OF THE INVENTION

Brief Description of the Drawings

The preferred and alternative embodiments of the present invention are described in detail below with reference to the following drawings.

DETAILED DESCRIPTION OF THE INVENTION

The present invention is a system and method for automatically and rapidly generating an integrated element model of an -integrated product. To develop a design for an integrated product, the designers develop a file of parameters for the desired product. After the inventive system reads the parameters, it applies rules from a database of rules to create a three-dimensioned "blank" for the engineers of various necessary disciplines to simultaneously consider.

As each engineering group brings its refinements to the "blank" they do so by generating a second-generation parameter input file that contains all of the parameters defining the blank as then configured as well as any refinements. This second input file propagates a second "blank" depicting the refinements over the first blank. The system allows for rapid iteration of the process to quickly reflect each group's contribution.

An exemplary host platform for the system of the invention will first be described. Then, a non-limiting example of model generation according to the invention will be described. Finally, routines for performing a method of the invention will be described.

Exemplary Host Platform

Figure 1:
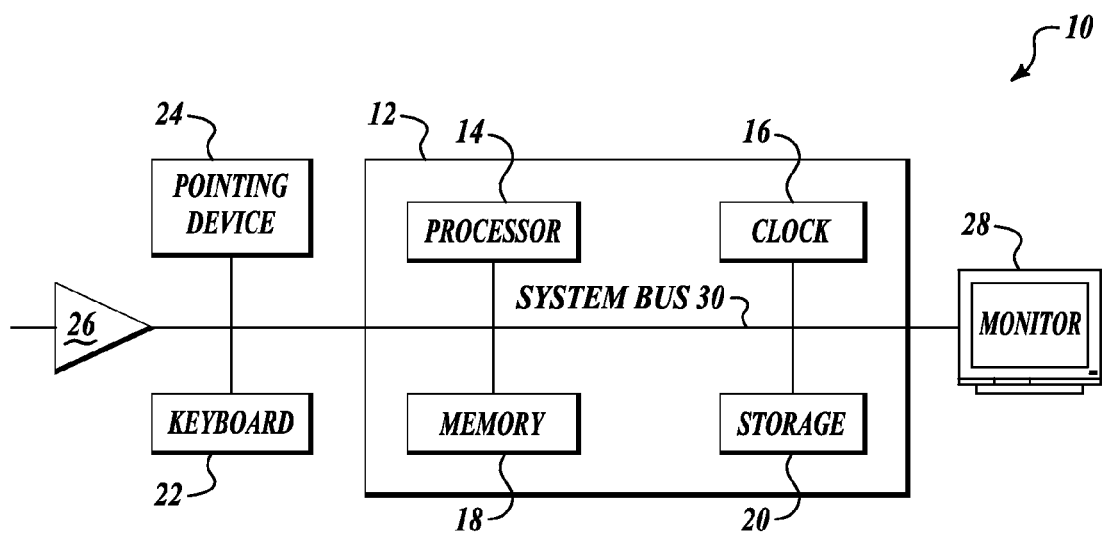
FIG. 1 is a block diagram of an exemplary host platform.

FIG. 1 shows a block diagram of an exemplary host platform 10 that is suitable for hosting software routines according to the invention. The platform 10 includes a computer 12. The computer 12 is suitably any computer that is arranged for performing computer-aided-design (CAD) functions or computer-aided-engineering (CAE) functions. As is known, the computer 12 includes a clock 16 controlling a processor 14. The computer 12 also includes memory 18, such as random access memory (RAM). The computer 12 also includes storage 20 such as a hard disc drive, a compact disc (CD) drive, a zip disc drive, a floppy disc drive, or the like. The computer 12, including the processor 14, is suitably arranged to operate in any acceptable operating system environment that supports CAD or CAE applications. Suitable operating system environments include UNIX, Linux, Windows, Macintosh, and DOS.

The host platform 10 also includes input devices such as a keyboard 22 and a pointing device 24, such as a mouse, a touch pad, a track ball, or the like. The host platform 10 also includes an input interface device 26 effecting an interface between the host platform 10 and other computing platforms, such as a CATIA workstation, and with other sources of input data. The host platform 10 also includes a monitor 28. A system bus 30 interconnects all components of the host platform 10.

The host platform 10 thus includes platforms such as UNIX workstations, personal computers, and Macintosh computers. For example, the exemplary host platform 10 is suitably a UNIX workstation, such as an IBM RS6000 workstation. Because these platforms are well known, further description of their construction and operation is not necessary for an understanding of the invention.

Integrated Element Model Generation

According to the present invention, a process is provided for rapidly generating an integrated model of an integrated product. The process uses rule-based techniques to generate the geometry and to create accurate models of both existing and new products. Due to the rapid creation according to rules, the process generates accurate representative model data for analysis allowing for rapid iteration of the design and analysis cycle. By virtue of this rapid iteration, groups of engineers can simultaneously work on the model and quickly memorialize their improvements by additional iterations of the cycle.

Figure 2:
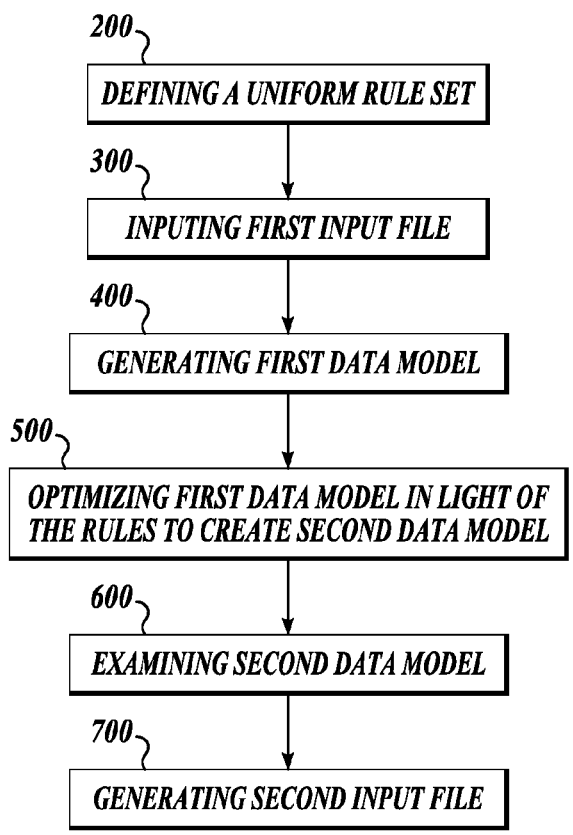
FIG. 2 is a first generation rule-based model.
Figure 3:
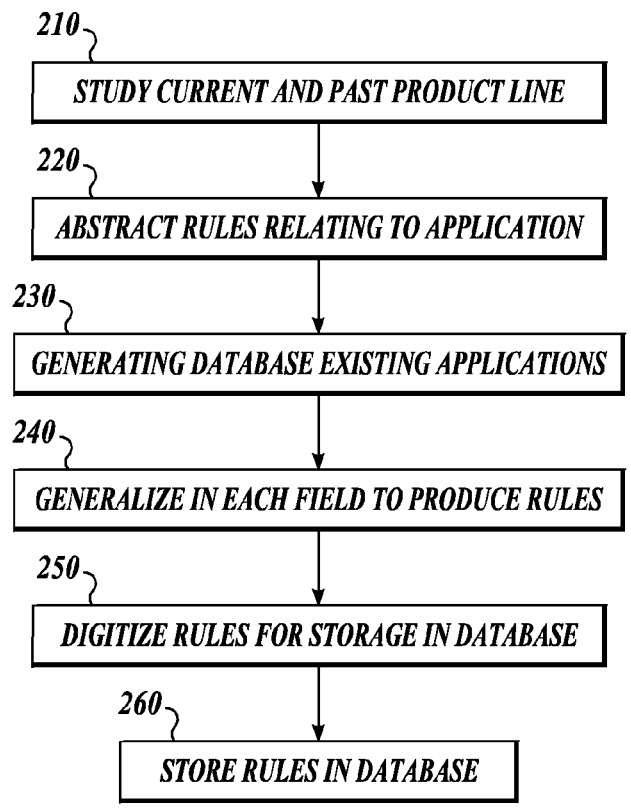
FIG. 3 is a first generation rule-based model with the input parameters for airfoils on the wings, stabilizer, and rudder.

FIG. 2 shows the inventive process. To make an integrated model, there must be a rules set 200. These rules serve as the operators on the parameters of the input file. One example of abstracting a rule set from a product model line is set forth in FIG. 3, though any means of generating a uniform rule set deemed practical by those skilled in the art. These rules define the actions of the inventive system on a set of parameters.

Once a rule set exists, at 300, the inventive system will work the rule on parameters input to the system in a file. The various parameters define the first data model at 400. This data model is a rough draft of the product generated for production. The need for a rough draft is to have a first iteration of rule application. In the course of operation, the inventive system then iterates the application of rules, to optimize the model 500. Once optimized, the engineering team can study the resulting model in depth by means of various legacy and third-party software specifically designed for engineering applications. Toward that end, the results of the examination will suggest new parameters for entry into a second data file. This data file, the engineers can use for another iteration of the model creation process.

The rules are a feature of the inventive system necessary to generate the model. The value of the rules rests with their completeness and their correspondence with laws of physics and the real world. One means of readily populating the rules database is to study the existing product line. While not the only means, the study of the existing products allows a manufacturer the opportunity to exploit the compiled data derived from product testing. In this preferred method, FIG. 3 defines the method of incorporating the collective knowledge the product line represents.

Starting at 210, the engineering team selects one or more of the several models in the product line for study. From known engineering and from continued and directed study, the team abstracts rules relating to the model at 220. The abstraction of rules is the "meat and potatoes" of most product engineering and is thus well-known to those skilled in the art. Understanding that, for example, the ratio of sprung to unsprung weight on an automobile yields a certain type of handling characteristic is a rule. Creating a mathematical relationship between the ratio and the presence of that handling characteristic is another such rule.

Figure 4:
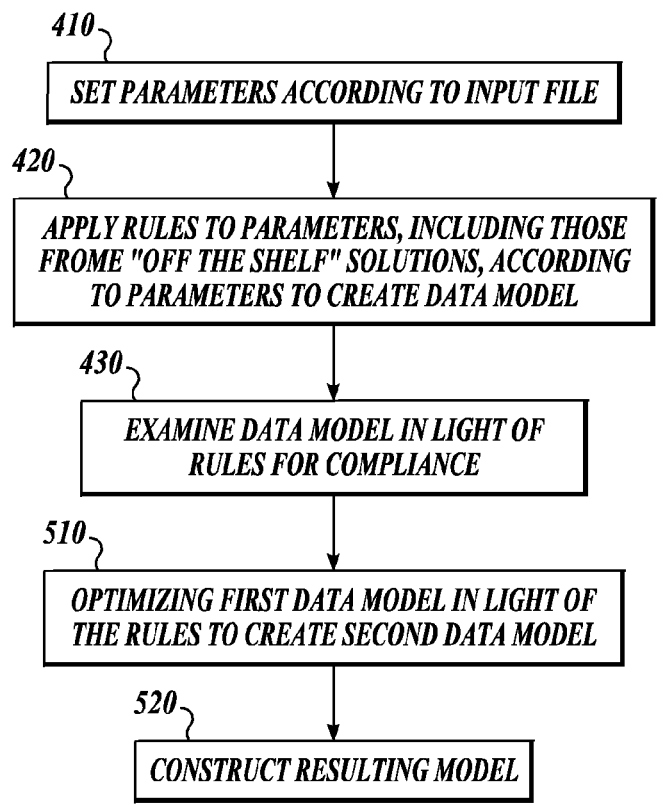
FIG. 4 is a second-generation rule-based model resulting from the application of rules upon the input file portrayed in FIG. 3.

Once a rule set is developed, the team can codify and store the rules in a database 230. Engineers might simply catalogue series of parameters and then relate them as models. Each parameter has a function label. Once the one or several studied products have yielded as many rules as might be useful the team then examines the resulting rules from the several products and then compares them at 240 across the whole of the product line. In light of the comparison, the team can ascertain trends across the product line, and from those trends generalize rules. As above, the team can catalogue the generalized rules and fill the database. FIG. 4 displays the inventive process. The designers of a new production model of a product will create an input file according to convention. While use of ASCII files is a preferred embodiment, any existing or, indeed, any file format adequate to store all of the discrete data terms designated will suffice. Those skilled in the computer sciences will determine appropriately applicable file formats.

At 410, the inventive system discerns the parameters contained in the data file. The inventive system sets parameters according to that input file. At 420, the system applies rules drawn from a rules database. For instance, where the parameters include the weight of an airplane, that parameter along with the anticipated cruising speed of the airplane will dictate a wingspan, chord, and airfoil for the airplane. Where, additionally, the input file includes the number of engines, the system readily calculates the capacity of each engine.

In light of each of the parameters produced initially by discerning the contents of the input file, the system can model a virtual model of the product in the memory of the system because of 420. This model is not merely a two-dimensioned drawing but an actual constellation of points and surfaces in three-dimensions. The model has attributes such as weight, balance, and dimensions. At 430, the system refines the model by applying the rules to the resulting three-dimensional model. In repeated iterations of the rules, at 510, the model becomes increasingly completely compliant with the database. After several iterations, the model is optimized in accord with the input file and the rules, producing a rating indicative of a "score" for compliance. By this means, at 520, the system constructs a resulting model that is well defined.

The principal purpose of such a model is to allow the engineers to examine it. Such a model presents the engineers with the subject matter of engineering analysis. With several variables embodied in the model, the engineers can begin the process of narrowing the final product by eliminating possible embodiments. In the course the analysis, the engineers can readily modify or augment the input file. In so doing, the engineers rapidly complete the model to a point where detail modeling is all that remains to complete the design of the product.

Figure 5:
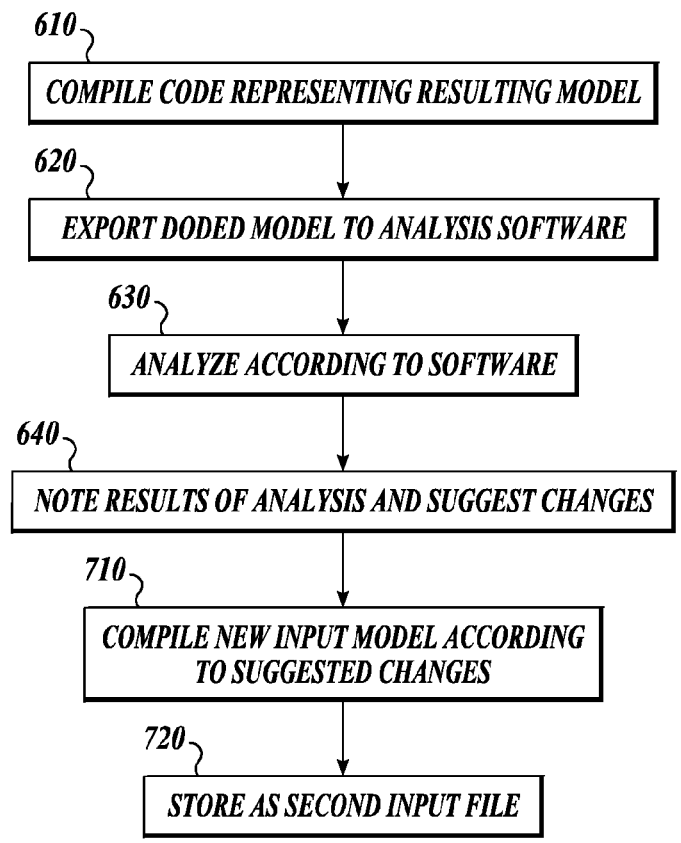
FIG. 5 is a flowchart that illustrates a method of testing a second-generation rule-based model according to an embodiment of the invention.

FIG. 5 portrays the method for testing of the model once produced by the inventive process. The inventive system creates the model as a data file 610. Once the model exists in the inventive system, the inventive system must export the model for study. One of the additional embodiments of the present invention has a front end that actually converts the model into one of the several software formats commonly used for testing such as Oracle 620.

The analysis of the model is then tested according to the rigors inherent in the legacy software 630. The model, once subjected to these testing programs, yields the data necessary to determine the success of the design. Finite element analysis, for instance, requires the generation of discrete elements that together comprise surfaces of the model. Because the model already exists in three dimensions, there is no need to generate surfaces, a costly and time-consuming process requiring a great deal of "eye-balling" by designers.

Because of analysis, relationships between many parameters and performance characteristics become apparent. These relationships suggest the use of different input parameters. In many cases, not one but several of the parameters might be changed to enhance performance. Engineers may compile a new input file 710 by means of the software aspects of this invention, as described below. This file, the engineers store the new input parameters as a file 720.

Figure 6:
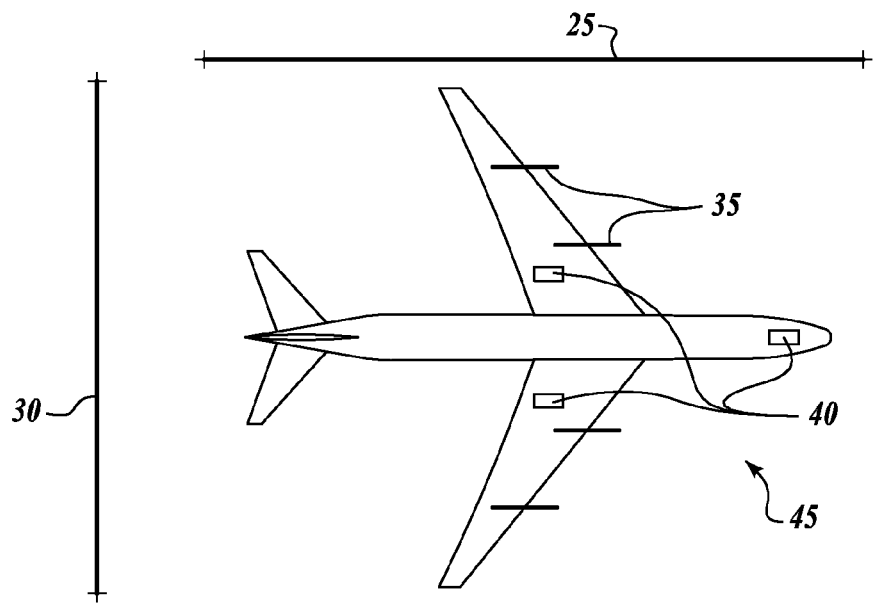
FIG. 6 is a screenshot showing the side-view interaction with the model through a graphic user interface.

FIG. 6 shows a screenshot of the program that generates an exemplary parameter set for the generation of an integrated model. For the purposes of this discussion, an airplane represents a non-limiting example of a manufactured product for which the inventive process can generate a model. Throughout this discussion, the airplane represents a good example of the sort of complexity the system is capable of producing. Far less complex examples of products will also work.

While FIG. 6 demonstrates the use of a graphic user interface to produce initial parameters of the inventive process, the parameter set in a preferred embodiment is an ASCII file. With "rubber" frame model 45 on the screen, the designer drags and drops the significant characteristics representative of design parameters onto a highly plastic graphic representation of the targeted product. Stretching a representation of the airframe establishes the overall length 25 of the airplane. Stretching the wingspan 30 yields the approximate essential dimensions of the targeted product.

The designer then may place engines 35 along the wings or in the empennage. In this case, the designer has placed four engines 35 on the airframe. To augment the established parameters, the designer places landing gear 40 on the frame. The final product begins to take a rough shape allowing some early estimating of the capacities, performance, and weight characteristics of the proposed product. The graphic user interface then generates an ASCII file that lists each of these specifications for input into the inventive process.

Figure 7:
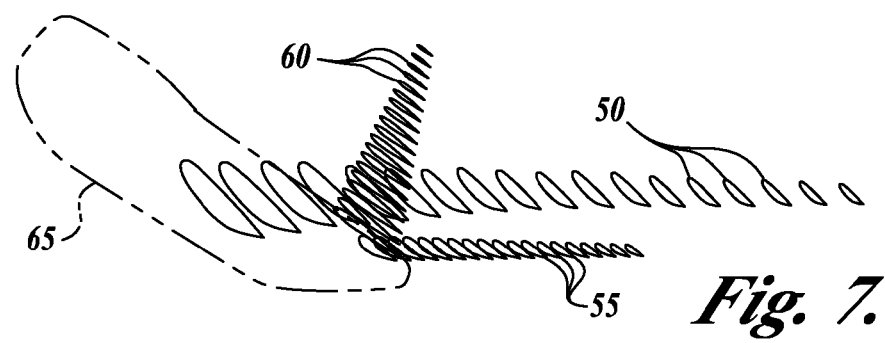
FIG. 7 is a screenshot showing the plan-view interaction with the model through a graphic user interface.

FIG. 7 shows some of the detail the input system allows. One of the parameters the input system allows, for example, is the defining the wings by the series of airfoils 50 they comprise. In the integration of an aircraft, once the desired parameters have been decided, the airfoil design is the first of the set parameters. On the "rubber" frame model 65, the designer places the wing airfoils 50, along with those for the stabilizer 55 and rudder 60. The interface and the resulting input file do allow the designers to selectively specify or release design parameters.

Figure 8:
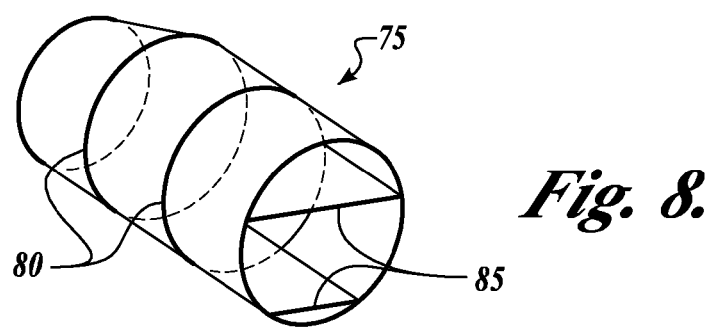
FIG. 8 is a portion of a model of a fuselage generated by an embodiment of the invention.

FIG. 8 shows a generated model detail of the fuselage according to the inventive process. Immediately evident is the placement of several ribs within the model 75, bulkheads 80, and floors 85. Each of these design features are placed according to rules that maximize utility and strength of the model while minimizing the weight. Because the inventive process removes the necessity of drafting these features into a model, the efficiency of the modeling process is readily apparent. Constrained only by the parameters the designers or engineers place in the input file and the rules in the inventive system, and the model results.

Figure 9:
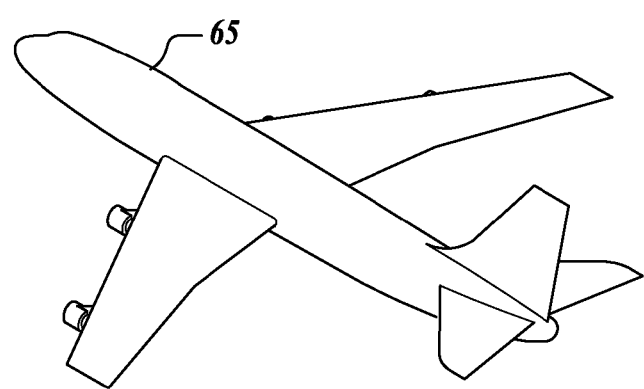
FIG. 9 is a model of an aircraft, generated by an embodiment of the invention.

FIG. 9 displays the model in toto, as opposed to the model detail in FIG. 8. Efficiencies in generation become more evident as one examines the complexity of the full model. Rules in the database allow rapid generation, rather than tasking draftsmen with looking up and replicating the features dictated by those rules.

Figure 10:
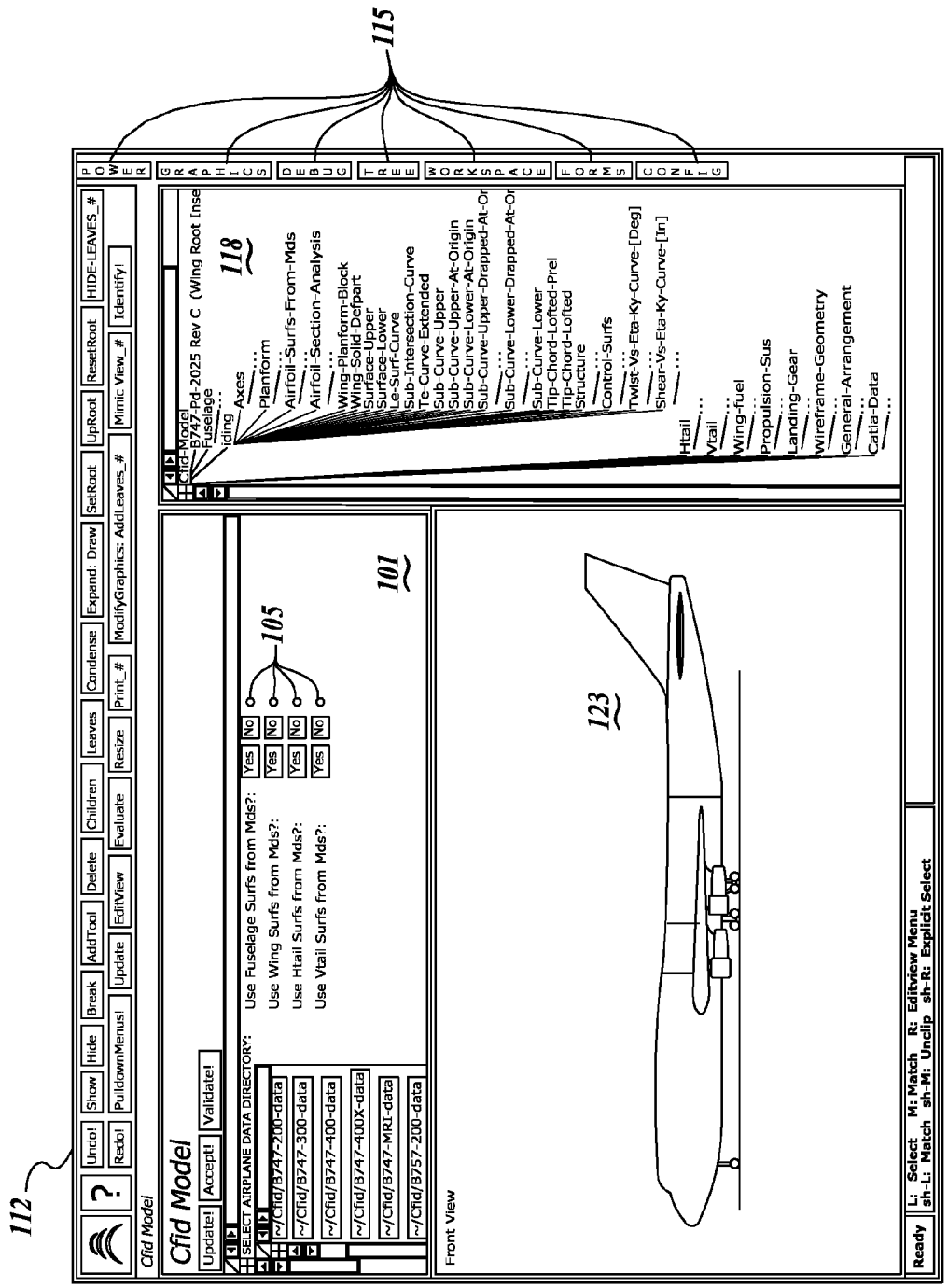
FIG. 10 is a screenshot generated by an embodiment of the invention.
Figure 11:
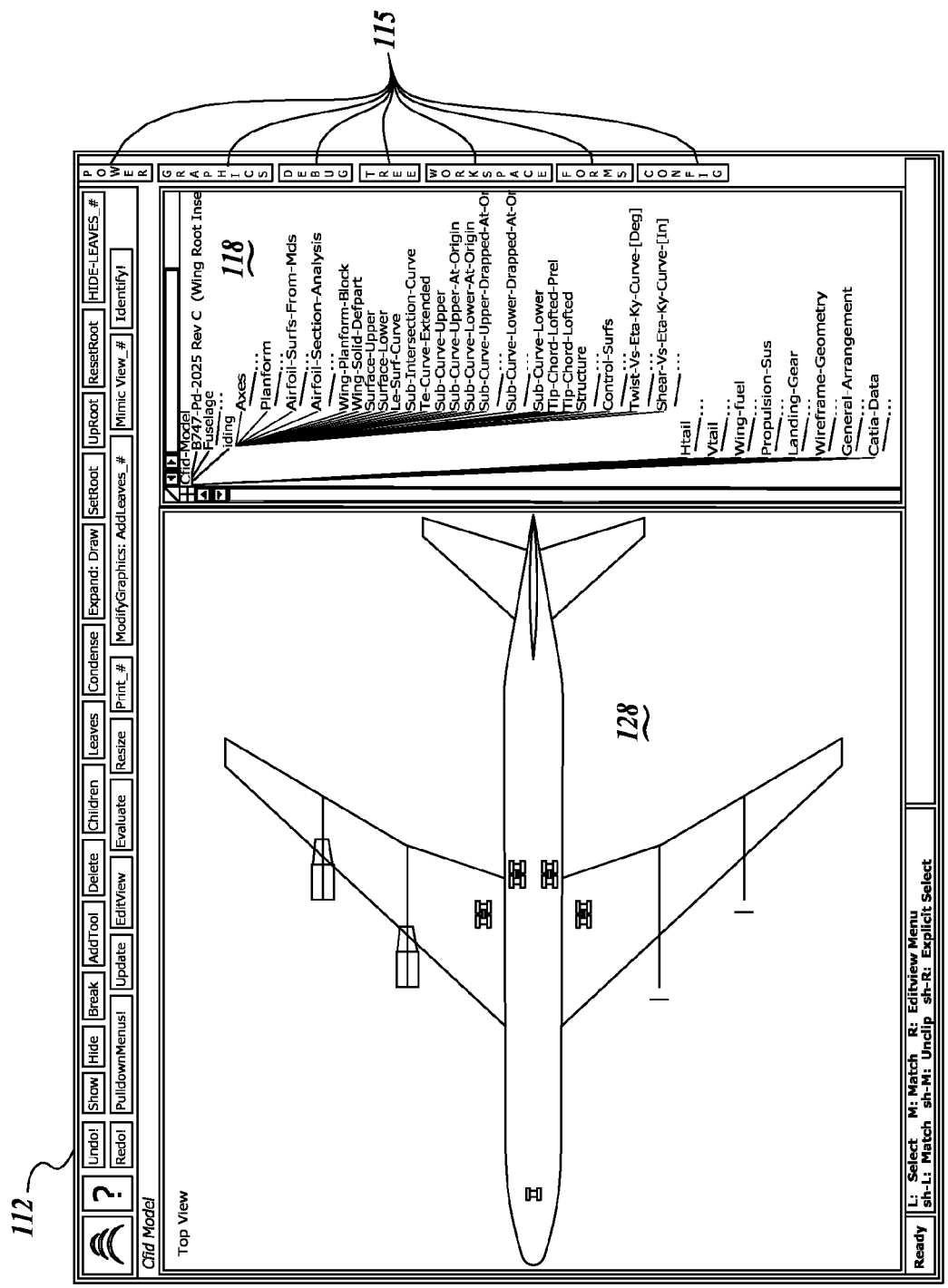
FIG. 11 is another screenshot generated by an embodiment of the invention.

FIGS. 10 and 11 are screenshots of the inventive computer product as it used to generate an input file. The inset 101 in FIG. 10 shows the option of incorporating existing parameters stored in distinct files. By toggling the selections available 105, the designer can adopt parameters from existing files to speed the development of the model. This adoption capability allows the utilization of the experience gained on these prior products. This same process of adopting parameters from earlier known products can be adapted to any sort of manufactured product.

Prior models are not the only sources of parameters. In the inset or frame 118, the screenshots in FIGS. 10 and 11, show the manual entry of parameters in treed parameter sets. These several parameters shown in the inset 118 define the input set that will generate the model. The inventive process presents a rough model in the browser as the parameters are determined, both in side view 123 and in plan view 128, as well as other views such as an oblique view or a front view. Preferably, the inventive product will allow view as the software rotates the model in the browser.

Also incorporated in the software is as series of utilities 115 and tools 112. The utilities assure the production of an accurate file using file checks such as the debugger and the graphic display. The tools allow the "rubber frame" modifications as well as modifications from a library of standardized actions. The tools also allow the "peeling" of a surface or skin of the model to reveal the interior of the model.

While a preferred embodiment of the invention has been illustrated and described, as noted above, many changes can be made without departing from the spirit and scope of the invention. Accordingly, the scope of the invention is not limited by the disclosure of the preferred embodiment. Instead, the invention should be determined entirely by reference to the claims that follow.

What is claimed is:

1. A method for automatically generating an integrated data model of a product, the method comprising:
   defining a uniform rule set;
   inputting a first input file defining parameters descriptive of the product;
   generating a first data model of the product, the principal components of which are defined in accord with the input file;

optimizing the first data model by applying the uniform rule set to the first data model to generate a second data model;

examining the second data model by compiling at least one compliance measure based upon the rule set; and generating a second input file based upon an examination of the at least one compliance measure.

2. The method of claim 1, wherein the uniform rule set comprises sets of rule-based templates of systems to exist in the product.

3. The method of claim 2, wherein the uniform rule set comprises rule-based templates of components of the systems.

4. The method of claim 3, wherein the rule-based template is automatically defined.

5. The method of claim 3, wherein the rule-based template is manually defined.

6. The method of claim 1, wherein the first input file comprises dimensions of the product.

7. The method of claim 1, wherein the first input file comprises parameters of systems to exist in the product.

8. The method of claim 7, wherein the first input file comprises parameters of components of a system.

9. The method of claim 8, wherein the parameters of the components further comprise placement of components of a system.

10. The method of claim 9, wherein the parameters are user-defined.

11. The method of claim 7, wherein the parameters comprise mass.

12. The method of claim 7, wherein the parameters comprise additional rules.

13. The method of claim 1, wherein the uniform rule set comprises physical properties of materials.

14. The method of claim 1, wherein the uniform rule set comprises structural assemblies within the product.

15. The method of claim 14, wherein the first input file comprises predetermined dimensions of the structural assemblies.

16. The method of claim 1, the uniform rule set comprises relationships of dimensions of a plurality of structural assemblies.

17. The method of claim 16, wherein the uniform rule set comprises dimensions of available structural components of structural assemblies.

18. The method of claim 16, wherein the uniform rule set comprises masses of available structural components of structural assemblies.

19. The method of claim 16, wherein the uniform rule set comprises placement of structural assemblies.

20. The method of claim 16, wherein the uniform rule set comprises the weight distribution of the product.

21. The method of claim 1, wherein examining further comprises a visual check of a three-dimensioned representation of the model.

22. The method of claim 1, wherein the examining further comprises downloading model data to software designed for analysis of the product.

23. The method of claim 22, wherein the software is a Computer Assisted Drafting program.

24. The method of claim 22, wherein the software is CATIA.

25. The method of claim 22, wherein the software is a database.

26. The method of claim 22, wherein the software is Oracle.

27. The method of claim 21, wherein the examining comprises construction of a physical representation of the model.

28. The method of claim 21, wherein examining includes finite element modeling.

29. The method of claim 28, wherein finite element modeling includes performing a load balance.

30. The method of claim 29, further comprising performing a mass analysis.

31. The method of claim 30, wherein the mass analysis creates a weight summary of the generated component structure.

32. The method of claim 30, wherein the mass analysis calculates a difference between weight of the finite element model and weight of an actual structure.

33. The method of claim 30, wherein the mass analysis calculates a difference between center of gravity of the finite element model and center of gravity of an actual structure.

34. The method of claim 1, wherein optimizing comprises scoring models for rules adherence.

35. The method of claim 34, further comprising performing a scoring iteration of the model.

36. The method of claim 35, wherein the rules can be selectively weighted.

37. The method of claim 1, wherein a finite element model is generated for each of a plurality of components, and wherein the finite element models of the components are interfaced at predetermined interface connections.

38. Computer readable medium for automatically generating an integrated data model of a manufactured product, the computer readable medium comprising:

computer readable medium for defining a uniform rule set;

computer readable medium for inputting a first input file defining parameters descriptive of the product;

computer readable medium for generating a first data model of the product, the principal components of which are defined in accord with the input file;

computer readable medium for optimizing the first data model by applying the uniform rule set to the first data model to generate a second data model;

computer readable medium for examining the second data model by compiling at least one compliance measure based upon the rule set; and computer readable medium for generating a second input file based upon an examination of the at least one compliance measure.

39. The computer readable medium of claim 38, wherein the computer readable medium for generating the uniform rule set comprises sets of rule-based templates of systems to exist in the product.

40. The computer readable medium of claim 39, wherein the uniform rule set comprises rule-based templates of components of the systems.

41. The computer readable medium of claim 40, wherein the rule-based template is automatically defined.

42. The computer readable medium of claim 40, wherein the rule-based template is manually defined.

43. The computer readable medium of claim 38, wherein the first input file comprises dimensions of the product.

44. The computer readable medium of claim 38, wherein the first input file comprises parameters of systems to exist in the product.

45. The computer readable medium of claim 44, wherein the first input file comprises parameters of components of a system.

46. The computer readable medium of claim 45, wherein the parameters of the components further comprise a computer readable medium for placement of components of a system.

47. The computer readable medium of claim 46, wherein the parameters are user-defined.

48. The computer readable medium of claim 45, wherein the parameters comprise mass.

49. The computer readable medium of claim 45, wherein the parameters comprise additional rules.

50. The computer readable medium of claim 38, wherein the uniform rule set comprises physical properties of materials.

51. The computer readable medium of claim 38, wherein the uniform rule set comprises structural assemblies within the product.

52. The computer readable medium of claim 51, wherein the first input file comprises predetermined dimensions of the structural assemblies.

53. The computer readable medium of claim 38, the uniform rule set comprises relationships of dimensions of a plurality of structural assemblies.

54. The computer readable medium of claim 53, wherein the uniform rule set comprises dimensions of available structural components of structural assemblies.

55. The computer readable medium of claim 53, wherein the uniform rule set comprises masses of available structural components of structural assemblies.

56. The computer readable medium of claim 53, wherein the uniform rule set comprises placement of structural assemblies.

57. The computer readable medium of claim 53, wherein the uniform rule set comprises the weight distribution of the product.

58. The computer readable medium of claim 38, wherein examining further comprises a visual check of a three-dimensioned representation of the model.

59. The computer readable medium of claim 38, wherein the examining further comprises downloading model data to software designed for analysis of the product.

60. The computer readable medium of claim 59, wherein the software is a Computer Assisted Drafting program.

61. The computer readable medium of claim 59, wherein the software is CATIA.

62. The computer readable medium of claim 59, wherein the software is a database.

63. The computer readable medium of claim 59, wherein the software is Oracle.

64. The computer readable medium of claim 58, wherein the examining comprises construction of a physical representation of the model.

65. The computer readable medium of claim 58, wherein examining includes finite element modeling.

66. The computer readable medium of claim 65, wherein finite element modeling includes performing a load balance.

67. The computer readable medium of claim 66, further comprising a computer readable medium for performing a mass analysis.

68. The computer readable medium of claim 67, wherein the mass analysis creates a weight summary of the generated component structure.

69. The computer readable medium of claim 67, wherein the mass analysis calculates a difference between weight of the finite element model and weight of an actual structure.

70. The computer readable medium of claim 67, wherein the mass analysis calculates a difference between center of gravity of the finite element model and center of gravity of an actual structure.

71. The computer readable medium of claim 38, wherein optimizing comprises scoring models for rules adherence.

72. The computer readable medium of claim 71, further comprising a computer readable medium for performing a scoring iteration of the model.

73. The computer readable medium of claim 72, wherein the rules can be selectively weighted.

74. The computer readable medium of claim 38, wherein a finite element model is generated for each of a plurality of components, and wherein the finite element models of the components are interfaced at predetermined interface connections.

75. A system for automatically generating an integrated data model of a product, the system comprising:
    means for defining a uniform rule set;
    means for inputting a first input file defining parameters descriptive of the product;
    means for generating a first data model of the product, the principal components of which are defined in accord with the input file;
    means for optimizing the first data model by applying the uniform rule set to the first data model to generate a second data model;
    means for examining the second data model by compiling at least one compliance measure based upon the rule set; and
    means for generating a second input file based upon an examination of the at least one compliance measure.

76. The system of claim 75, wherein the uniform rule set comprises sets of rule-based templates of systems to exist in the product.

77. The system of claim 76, wherein the uniform rule set comprises rule-based templates of components of the systems.

78. The system of claim 77, wherein the rule-based template is automatically defined.

79. The system of claim 77, wherein the rule-based template is manually defined.

80. The system of claim 75, wherein the first input file comprises dimensions of the product.

81. The system of claim 75, wherein the first input file comprises parameters of systems to exist in the product.

82. The system of claim 81, wherein the first input file comprises parameters of components of a system.

83. The system of claim 82, wherein the parameters of the components further comprise placement of components of a system.

84. The system of claim 83, wherein the parameters are user-defined.

85. The system of claim 81, wherein the parameters comprise mass.

86. The system of claim 81, wherein the parameters comprise additional rules.

87. The system of claim 75, wherein the uniform rule set comprises physical properties of materials.

88. The system of claim 75, wherein the uniform rule set comprises structural assemblies within the product.

89. The system of claim 88, wherein the first input file comprises predetermined dimensions of the structural assemblies.

90. The system of claim 75, the uniform rule set comprises relationships of dimensions of a plurality of structural assemblies.

91. The system of claim 90, wherein the uniform rule set comprises dimensions of available structural components of structural assemblies.

92. The system of claim 90, wherein the uniform rule set comprises masses of available structural components of structural assemblies.

93. The system of claim 90, wherein the uniform rule set comprises placement of structural assemblies.

94. The system of claim 90, wherein the uniform rule set comprises the weight distribution of the product.

95. The system of claim 75, wherein examining further comprises a visual check of a three-dimensioned representation of the model.

96. The system of claim 75, wherein the examining further comprises downloading model data to software designed for analysis of the product.

97. The system of claim 96, wherein the software is a Computer Assisted Drafting program.

98. The system of claim 96, wherein the software is CATIA.

99. The system of claim 96, wherein the software is a database.

100. The system of claim 96, wherein the software is Oracle.

101. The system of claim 95, wherein the examining comprises construction of a physical representation of the model.

102. The system of claim 95, wherein examining includes finite element modeling.

103. The system of claim 102, wherein finite element modeling includes performing a load balance.

104. The system of claim 103, further comprising a system for performing a mass analysis.

105. The system of claim 104, wherein the mass analysis creates a weight summary of the generated component structure.

106. The system of claim 104, wherein the mass analysis calculates a difference between weight of the finite element model and weight of an actual structure.

107. The system of claim 104, wherein the mass analysis calculates a difference between center of gravity of the finite element model and center of gravity of an actual structure.

108. The system of claim 75, wherein optimizing comprises scoring models for rules adherence.

109. The system of claim 108, further comprising a system for perfonning a scoring iteration of the model.

110. The system of claim 108, wherein the rules can be selectively weighted.

111. The system of claim 75, wherein a finite element model is generated for each of a plurality of components, and wherein the finite element models of the components are interfaced at predetermined interface connections.

* * * * *